United States Patent
Waheed et al.

(10) Patent No.: US 10,659,096 B2
(45) Date of Patent: May 19, 2020

(54) FREQUENCY SCAN WITH RADIO MAINTAINED IN ACTIVE STATE

(71) Applicant: NXP USA, INC., Austin, TX (US)

(72) Inventors: Khurram Waheed, Austin, TX (US); Carlos Alberto Neri Castellanos, Zapopan (MX)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/015,287

(22) Filed: Jun. 22, 2018

(65) Prior Publication Data

US 2019/0393920 A1    Dec. 26, 2019

(51) Int. Cl.
*H04B 1/40*    (2015.01)
*H03L 7/085*   (2006.01)
*H03L 7/099*   (2006.01)
*H03L 7/197*   (2006.01)

(52) U.S. Cl.
CPC .............. *H04B 1/40* (2013.01); *H03L 7/085* (2013.01); *H03L 7/099* (2013.01); *H03L 7/1976* (2013.01)

(58) Field of Classification Search
CPC ........... H04B 1/40; H03L 7/085; H03L 7/099; H03L 7/1976
USPC ......................................................... 455/77
See application file for complete search history.

(56) References Cited

U.S. PATENT DOCUMENTS

| 4,105,948 | A | 8/1978 | Wolkstein |
| 5,334,952 | A | 8/1994 | Maddy et al. |
| 6,163,687 | A | 12/2000 | Scott et al. |
| 6,211,740 | B1 | 4/2001 | Dai et al. |
| 6,597,249 | B2 * | 7/2003 | Chien .................... H03L 7/099 327/147 |
| 6,876,262 | B2 | 4/2005 | Gharpurey et al. |
| 7,675,369 | B2 | 3/2010 | Backes |
| 2004/0062334 | A1 * | 4/2004 | Poon .................. H04N 21/4305 375/376 |
| 2008/0111635 | A1 | 5/2008 | Miller |
| 2011/0260763 | A1 | 10/2011 | Wang |
| 2015/0048868 | A1 | 2/2015 | Zhao et al. |
| 2017/0094641 | A1 | 3/2017 | Asuri et al. |
| 2017/0310458 | A1 | 10/2017 | Zanuso et al. |

* cited by examiner

*Primary Examiner* — Eugene Yun

(57) ABSTRACT

A method of performing a frequency scan at a radio includes placing the radio in an active mode and, while maintaining the radio in the active mode, for each of a plurality of target frequencies determining a coarse frequency tuning value based on the target frequency. The radio places a phase locked loop (PLL) in an open-loop configuration and while the PLL is in the open-loop configuration, programs the VCO with the coarse frequency tuning value. The radio programs the divider with a feedback adjustment based on the target frequency, places the PLL in a closed-loop configuration, and in response to the PLL reaching a settled state, performs an operation based on an output signal of the PLL.

20 Claims, 8 Drawing Sheets

FREQUENCY SCAN WITH RADIO MAINTAINED IN ACTIVE STATE

BACKGROUND

Field of the Disclosure

The present disclosure relates generally to phase locked loops and more particularly to frequency scanning with phase locked loops.

Description of the Related Art

Wireless localization, including wireless ranging, direction finding and location is used in a variety of applications, including car access systems, asset tracking systems, proximity sensors, gaming applications, security applications, and others. To support wireless localization between two devices, a system employs a radio at each device, with one device communicating packets to the other device, and with the other device responding with return packets. One method of localization can be implemented based on the time at which the test packet was transmitted and the time at which the return packet is received, the transmitting device can calculate a time-of-flight (ToF) of the packets and, based on the ToF, determine a distance (range) between the two devices. The determined distance can be employed for a variety of functions, such as taking a specified action (e.g., unlocking a car) when the distance is below a threshold.

Some wireless localization systems employ multi-frequency phase based ranging or other techniques wherein the transmit frequency of one or more of the radios is varied during the ranging process. Such techniques can improve ranging resolution and may also support direction finding or localization with a limited number of radio antennas. To vary the frequency among a range of target frequencies, a wireless localization system can employ a "frequency scan" approach, whereby the ranging system successively tunes a phase locked loop (the PLL) of the system to each target frequency, thereby setting the transmit frequency to the target frequency. However, conventional frequency scan techniques are undesirably time consuming and consume a relatively large amount of power.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-8 illustrate techniques for performing a frequency scan using a PLL of a wireless radio while maintaining the wireless radio in an active mode. For each target frequency of the frequency scan, the PLL is coarsely tuned by accessing a pre-calibrated set of coarse tuning values, by interpolating a coarse frequency value based on an initial tuned coarse frequency value for an initial target frequency, or by triggering a coarse frequency tuning engine (CFTE) via an override of a target input for the CFTE, resulting in a coarse frequency tuning (CFT) setting for the target frequency. The PLL is placed in an open loop state, a fractional divider value for the PLL is computed based on the CFT setting, and the fractional divider value is programmed to a fractional divider of the PLL. The PLL loop is closed and, after a predefined settling time, the radio executes a corresponding operation (e.g., a ranging or a communication operation) at the target frequency using the output of the PLL. The radio is maintained in the active mode until an operation for the final target frequency in the frequency scan range has been performed, thereby reducing overall frequency scan time and conserving power.

In contrast to the techniques described herein, a conventional wireless radio typically executes a frequency scan via multiple transitions of the radio between active and inactive (e.g., off) modes. In particular, a conventional wireless radio typically performs a frequency scan by, for each target frequency, transitioning the radio from an inactive mode to an active mode, tuning the PLL to the target frequency, performing the wireless operation at the target frequency, and transitioning the radio back to the inactive mode. Thus, the conventional frequency scan approach involves transitions between the inactive and active modes for each target frequency. These multiple transitions extend the time and power required to execute the frequency scan. Using the techniques described herein, the radio is maintained in the active mode during the frequency scan, eliminating most of the transitions between the active and inactive modes, thereby reducing scan time and power consumption.

Figure 1:
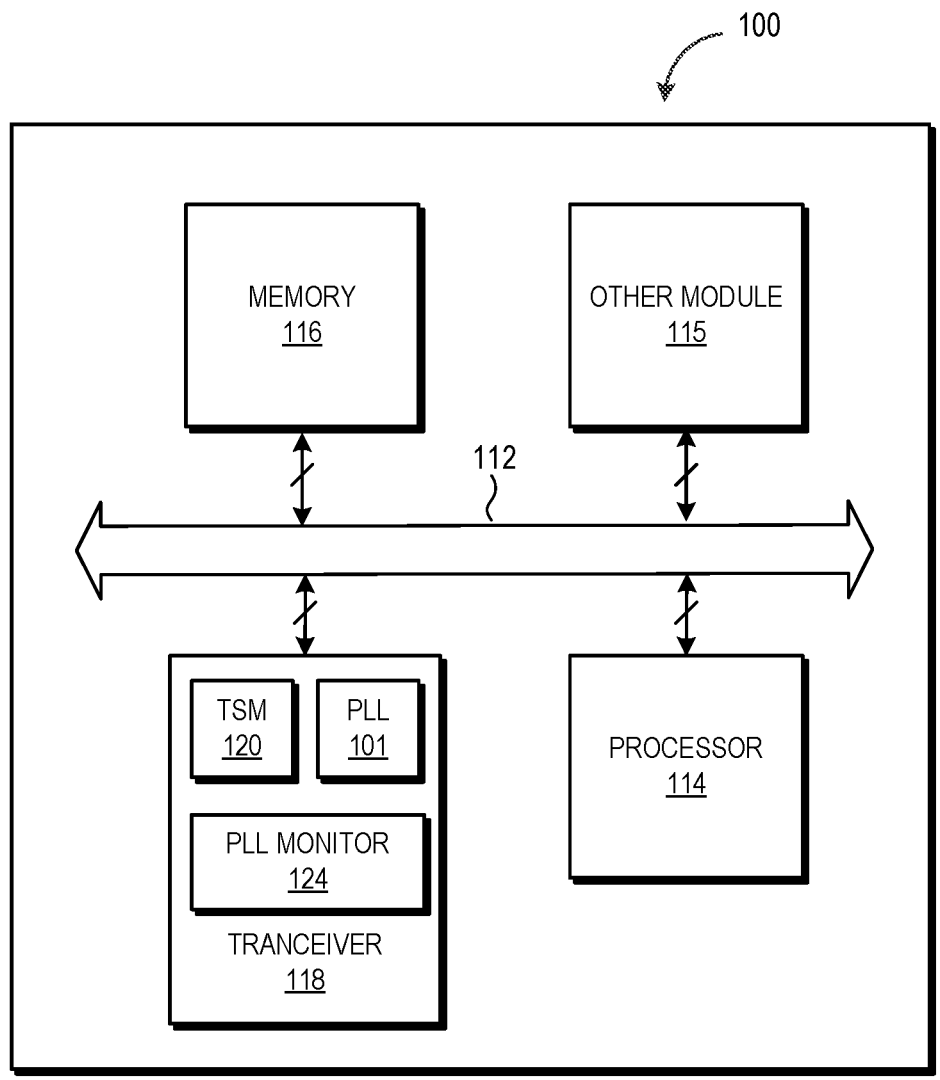
FIG. 1 is s a block diagram of an embodiment of a system-on-a-chip (SOC) including a radio frequency transceiver having a phase locked loop (PLL) that can perform a frequency scan while maintaining a wireless radio in an active state in accordance with at least one embodiment.

FIG. 1 is a block diagram of an embodiment of an integrated circuit for a system-on-a-chip (SOC) 100 including radio frequency transceiver 118. SOC 100 includes a bus 112, a processor 114, one or more other modules 115, and a memory 116, along with radio frequency (RF) transceiver 118. Each of processor 114, module 115, memory 116, and transceiver 118 is bi-directionally coupled to bus 112. Bus 112 can be any type of bus for communicating any type of information such as data, interrupts, address, or instructions. SOC 100 has been simplified for ease of illustration. For example, there may be multiple processors similar to processor 114 or different from processor 114. In one embodiment, processor 114 may be any type of microprocessor (MPU), microcontroller (MCU), or digital signal processor (DSP). Also, memory 116 may be shared between the multiple processors. One or more other modules 115 may include circuits to provide specific functionally, such as for example, additional memories, a direct memory access (DMA) controller, a debug module, arbitration circuits, power management circuits, communication circuits, etc. Memory 116 may be any type of volatile or non-volatile memory, such as static random access memory (SRAM), dynamic random access memory (DRAM), flash, etc.

Transceiver 118 includes transceiver sequence manager (TSM) 120, PLL lock monitor 124, and PLL 101 and can communicate using any one or more communication protocols. For example, in one embodiment, transceiver 118 may be a RF transceiver for short range communication using the IEEE 802.15.4 communication protocol. In another embodiment, transceiver 118 may be used for a different protocol, such as Bluetooth. As described further herein, in at least one embodiment the transceiver 118 can be configured to perform a frequency scan while maintaining the PLL 101 in an active mode, thereby reducing the amount of time required by the scan and also conserving power.

Figure 2:
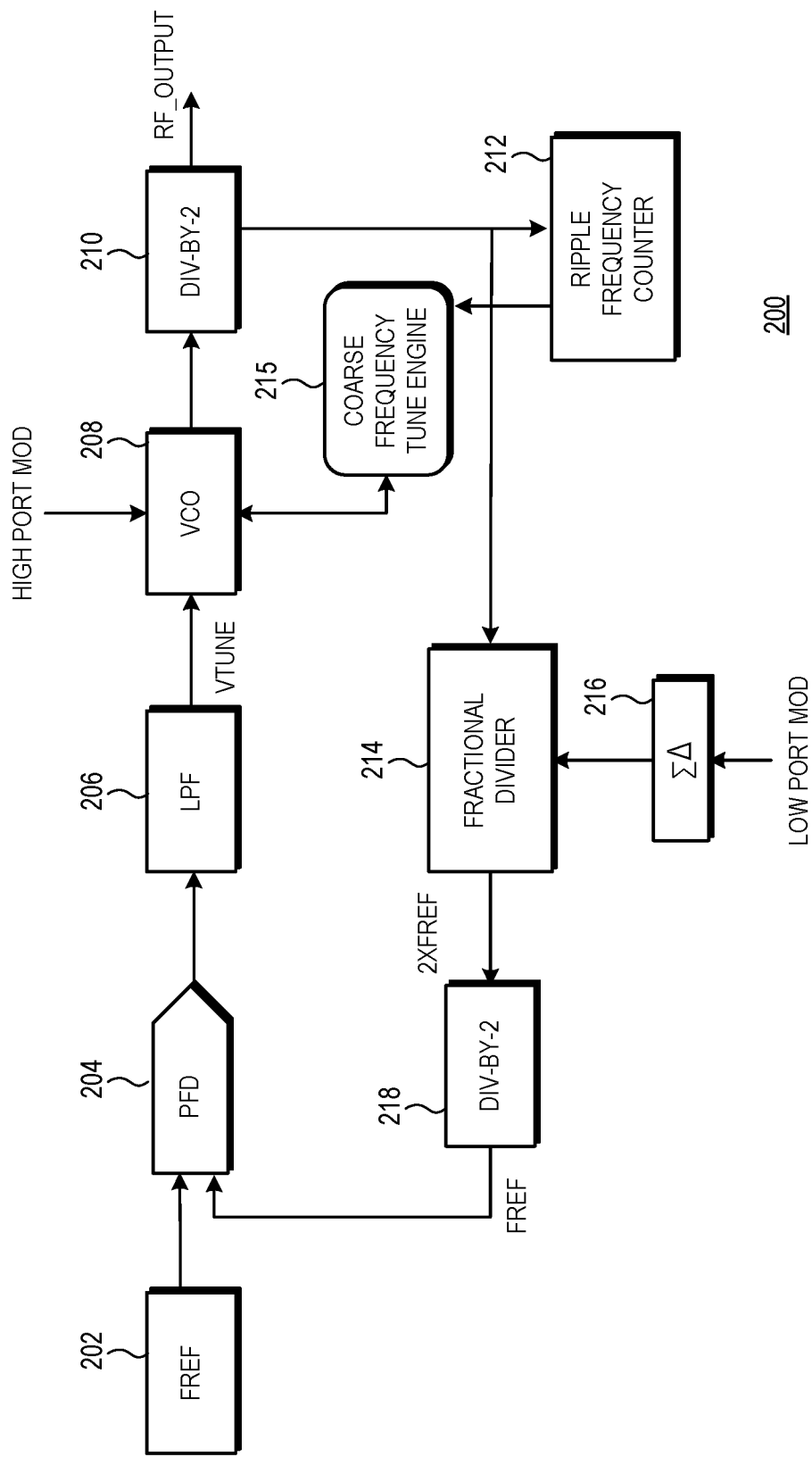
FIG. 2 is a block diagram of an example PLL of FIG. 1 that can perform a frequency scan while maintaining a wireless radio in an active state in accordance with at least one embodiment.

FIG. 2 illustrates a block diagram of the PLL 101 in accordance with at least one embodiment. The PLL 101 includes a reference frequency source 202, a phase/frequency detector 204, a low-pass filter (LPF) 206, a voltage-controlled oscillator (VCO) 208, a coarse frequency tune engine (CFTE) 215, a divide-by-two modules 210 and 218, a ripple frequency counter 212, a fractional divider 214, and a sigma-delta modulator 216. The frequency source 202 has an output to provide a stable reference frequency signal. The phase/frequency detector 204 has a first input for receiving the reference frequency signal, a second input for receiving a feedback signal from the divide-by-two module 218, and an output coupled to an input of the LPF 206. The VCO 208 includes an input coupled to an output of the LPF 206, an input for receiving a VCO tuning signal labeled from the CFTE 215, an input receiving a high port modulation tuning signal, and an output coupled to the divide-by-two module 210. The divide-by-two module 210 includes an output to provide an RF output signal labeled "RF OUTPUT" and an output coupled to an input of the ripple frequency counter 212. The ripple frequency counter 212 includes an output coupled to an input of the CFTE 215.

The fractional divider 214 includes an input coupled to the output of the divide-by-two module 210 an output coupled to an input of the divide-by-two module 218. The divide-by-two module 218 includes an output coupled to an input of phase/frequency detector 204. It will be appreciated that in other embodiments the PLL 101 does not include the divide-by-two modules 210 and 218. Sigma-delta modulator 216 has an input to receive a low port modulation tuning signal and an output coupled to an input of fractional divider 214.

In the illustrated embodiment, the PLL 101 includes both digital and analog circuitry. In other embodiments, PLL 101 may be characterized as either an analog PLL that uses primarily or entirely analog modules, or a digital PLL, that uses primarily or entirely digital modules, and the concepts discussed herein will be equally applicable to both. The PLL 101 is generally configured to generate the RF OUTPUT signal such that the signal is locked to a target frequency. In particular, the phase/frequency detector 204 generates a control voltage based on a difference between the reference frequency signal and the feedback signal provided by the divide-by-two module 118. The LPF 206 filters the control voltage, and the VCO 208 adjusts the RF OUTPUT signal based on the filtered control voltage. In other embodiments, the VCO 208 may be replaced with an oscillator having a different topology, such as a ring oscillator.

To assist in locking the RF OUTPUT signal to the target frequency, the CFTE provides a band selection signal to the VCO 208. Based on the band selection signal, the VCO 208 sets one or more internal frequency control components (e.g., one or more varactors) to drive the frequency of the RF OUTPUT signal close to (e.g. within a few megahertz) of the target frequency.

The VCO 208 also receives a tuning signal from a dual port modulator (not shown). The dual port modulator combines a tuning signal with the target frequency and provides the resulting output to adjust sigma-delta modulator 216 for the selected frequency band. Sigma-delta modulator 216 provides a signal for setting fractional divider 214 for the selected frequency band. Together the tuning signals from the dual port modulator adjust the output frequency of output signal RF OUTPUT so that the output frequency is locked to the target frequency. The adjusted output signal RF OUTPUT is fed back to phase/frequency detector 204 through the fractional divider 214. In one embodiment, fractional divider 214 is a programmable multi-modulus divider controlled by sigma-delta modulator 216. Using fractional divide values provides a PLL with higher resolution. In one embodiment, sigma-delta modulator is characterized as being a third-order sigma-delta modulator. In other embodiments, sigma-delta modulator 216 may be a different type of fractional modulator.

In one embodiment, the VCO 208 can be implemented as a conventional negative transconductance metal-oxide semiconductor (MOS) inductive-capacitive (LC) oscillator circuit. The LC oscillator includes one or more banks, or arrays, of varactors (variable capacitors) for tuning the VCO 208 with respect to frequency (not shown). In one embodiment, a varactor in a bank of varactors is implemented as a capacitor and a switch. In another embodiment, a variable capacitance of a varactor is controlled using a control voltage. Alternately, a varactor may be implemented differently. In accordance with the described embodiment, a size, or capacitance value, of each varactor in a bank of varactors is based on a binary weighting, or bit position in the bank. For example, a least significant bit (LSB) position would have a smaller, or smallest, sized capacitor, and a most significant bit (MSB) position would have a larger, or largest, sized capacitor. In another embodiment, all of the varactors in a bank may be sized similarly. In yet another embodiment, the change in capacitance is a function of a change in the control voltage supplied to a single varactor. In still another embodiment, the bank is a hybrid bank wherein at least some of the varactors are implemented as a thermometric bank.

In at least one embodiment, the PLL 101 is employed in a device having a wireless radio, wherein the RF OUTPUT signal is used by the radio to perform one or more designated operations, such as transmission of packets to one or more receiving devices. Further, in at least one embodiment the radio can be placed in a frequency scan mode, whereby the radio performs each operation in a set of operations at a different corresponding scan frequency—for example, transmitting each packet in a set of packets at a different corresponding scan frequency.

To implement the frequency scan mode at the PLL 101, the device first obtains the set of scan frequencies, also referred to herein as the set of target frequencies for the PLL 101 For each target frequency, the device implements the following operations at the PLL 101: 1) the device uses the CFTE 215 to determine a coarse frequency tuning (CFT) value (example techniques for determining the CFT setting are described below with respect to FIGS. 4-7); 2) the PLL 101 is placed in an open loop state by, for example, disabling one or more of the fractional divider 214, the phase/frequency detector 204, the LPF 206, and the divide-by-two module 218 (or 210); 3) while in the open-loop mode programming the CFT setting to the VCO 208; 4) while in the open-loop mode, computing and programming the fractional divider value for the fractional divider 214; 5) placing the PLL 101 in a closed loop state (by re-enabling the one or more disabled modules); and 6) after waiting a specified amount of time for the PLL 101 to settle, performing the specified operation at the radio using the RF OUTPUT signal. It will be appreciated that the device maintains the radio in an active mode during each of the above-referenced operations, including maintaining the radio in the active mode while the target frequency is changed. The device can thereby reduce frequency scan time and conserve power.

Figure 3:
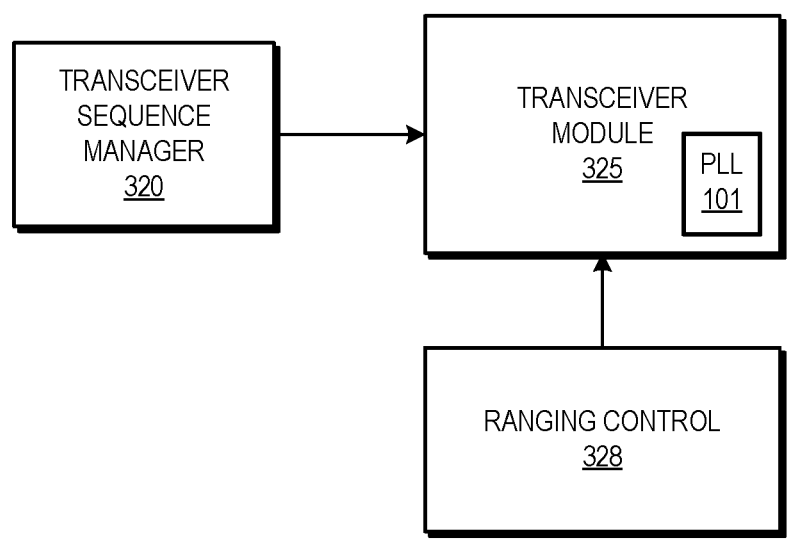
FIG. 3 is a block diagram of a device that employs the PLL of FIG. 1 for wireless localization in accordance with at least one embodiment.

FIG. 3 illustrates a block diagram of a device 300 including a transceiver 325 that employs the PLL 101 in accordance with at least one embodiment. For purposes of description, it is assumed that the device 300 is part of a wireless localization system that is generally configured to determine a distance between the device 300 and another device (not shown) employing a multi-phase wireless localization protocol. Accordingly, the wireless localization system can be employed in a variety of applications and the device 300 can be any of a variety of devices such as, for example, an automobile or a fob, and the distance identified by the wireless localization system is used to determine whether a user is in close proximity to the automobile to, for example, automatically unlock an automobile door. In another embodiment, the device 300 is a sensor device located in a warehouse, or a sensor affixed to an asset to be tracked, and the distance identified by the wireless localization system is used to determine whether the asset has been removed from a warehouse shelf or other storage location. In still another embodiment, the device 300 is a cell phone or other small or hand-held device that uses the frequency scan for direction finding using a relatively small number of antennas.

To support wireless localization, the transceiver 325 is generally configured to transmit and receive packets according to one or more specified wireless protocols, such as Bluetooth-LE (BLE), IEEE 802.15.4, and Gaussian frequency-shift keying (GFSK), frequency shift keying (FSK) and orthogonal QPSK protocols, and the like, or a custom wireless protocol. In at least one embodiment, in addition to the wireless localization functions described further herein, the transceiver 325 is used to communicate other data between the device 300 and one or more other devices according to the corresponding wireless protocol. Such data can include, for example, device identification data, security data, multimedia data, and the like.

To conserve power, the device 300 includes a transceiver sequence manager (TSM) 320 that controls a power mode of the transceiver 325 by, for example changing one or more of a supply voltage, supply current, and clock frequency of a clock that are supplied to the transceiver 325. In addition, the TSM 320 can control other aspects of the device 300, such as controlling calibration of the PLL 101 and enabling or disabling modules of the radio 325 in a specified sequence (such as when changing the power mode). In at least one embodiment, the TSM 320 can place the transceiver 325 in either of two power modes: a low-power mode and an active mode. In the active mode, the transceiver 325 is able to perform normal operations, including tuning of the PLL 101 to a target frequency, transmission and reception of packets, and other operations. In the low-power mode the transceiver 325 is not able to transmit or receive packets. In at least one embodiment, the low-power mode corresponds to an off mode wherein the transceiver 325 is not able to perform any operations. In another embodiment, the low-power mode corresponds to a sleep mode, wherein the transceiver 325 is not able to tune the PLL 101 to a target frequency or able to transmit or receive packets but is able to retain data stored at the transceiver 325 during the active mode.

To support wireless localization, the device 300 includes a ranging control module 328 that controls tuning of the PLL 101 during ranging operations. In at least one embodiment, during a ranging operation, the ranging control module 328 performs one or more of the frequency scan operations described herein, including identification of the set of scan frequencies (e.g., from a stored predefined set of scan frequencies or calculated on-the-fly based using a mathematical relationship or defined based on a set of rules such as typically described in wireless standards as a hopping algorithm. A hopping pattern may also skip a set of frequencies in the scanning to avoid interferers, co-existence with other services and/or performing a sparse spectral measurement), identification of the corresponding target frequencies and provision of the target frequencies to the CFTE 215, placing the PLL 101 in an open loop state and returning the PLL 101 to the closed loop state, and computing the fractional divider value for the target frequency and programming the fractional divider 214 with the fractional divider value. The ranging control module 328 can also perform other operations associated with ranging, including managing the transmission and receipt of packets at the transceiver 325, calculation of times of flight based on the transmitted and received packets, and calculating distances based on the calculated times of flight.

Figure 4:
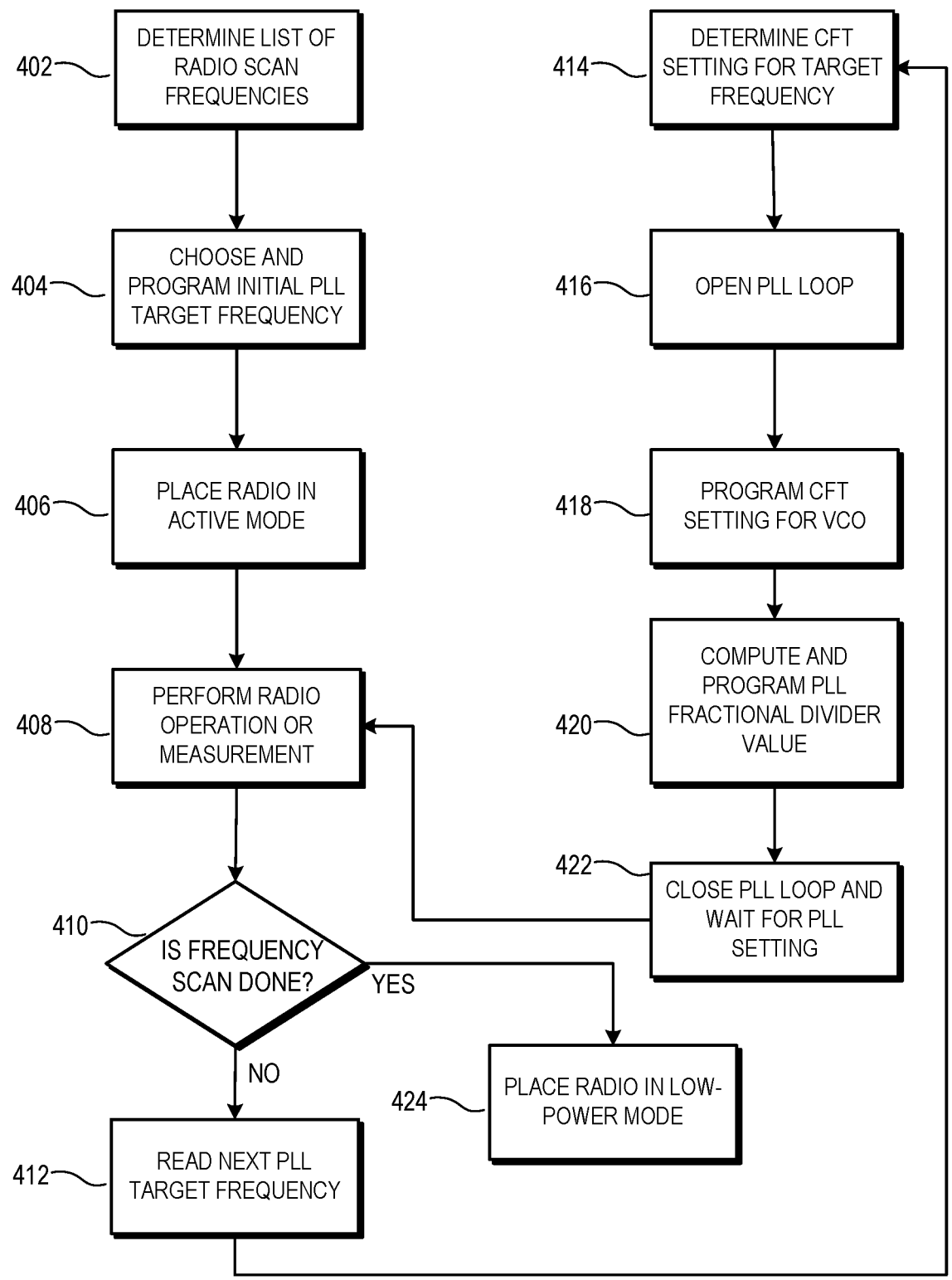
FIG. 4 is a flow diagram of a method of performing a frequency scan at a PLL of a wireless radio while maintaining the radio in an active state in accordance with at least one embodiment.

FIG. 4 is a flow diagram of a method 400 of performing a frequency scan at a PLL in accordance with at least one embodiment. For purposes of description, the method 400 is described with respect to an example implementation at the PLL 101 and the device 300 of FIGS. 2 and 3 respectively. At block 402, the ranging control module 328 identifies the set of scan frequencies for the frequency scan. The ranging control module 328 can identify the set of scan frequencies in a variety of ways, including accessing a stored predefined list of scan frequencies, receiving the set of scan frequencies from another device, and the like. At block 404, the ranging control module 328 selects an initial target frequency from the set of scan frequencies.

At block 406, the ranging control module 328 instructs the TSM 320 to place the transceiver 325 in the active mode, so that the transceiver 325 is ready for tuning and normal operations. As part of placing the transceiver 325 in the active mode, the PLL 101 is tuned to the initial target frequency selected at block 404. In at least one embodiment, the PLL 101 is tuned to the initial target frequency as follows: the PLL 101 is placed into an open-loop state (by, for example, disengaging the fractional divider 214). In the open-loop state, the CFTE 215 generates a coarse frequency tuning (CFT) value using a successive approximation algorithm. For example, as described further below, the CFTE 215 can include a successive approximation register (SAR)

have a plurality of bits. The CFTE 215 successively sets the value of the bits of the SAR, from most significant to least significant, via a corresponding succession of comparisons between the output of the ripple frequency counter 212 and the expected frequency count indicated by the initial target frequency. After the value of each bit has been set, the SAR stores the CFT setting. In at least one embodiment, the VCO 208 sets the state of one or more varactors based on the CFT setting, thereby setting the output frequency of the VCO 208 to within a specified range, referred to as a coarse tuning step, of the initial target frequency. After generating the CFT, the PLL 101 is placed into a closed-loop state (by, for example, re-engaging the fractional divider 214). After a specified amount of time (e.g., 3 to 4 time constants of the PLL 101), the RF OUTPUT signal is tuned to the initial target frequency.

At block 408, the transceiver 325 performs a specified operation using the RF OUTPUT signal with the PLL 101 tuned to the initial target frequency. In at least one embodiment the specified operation is at least one of transmission or receipt of a packet including a timestamp that can be used by the device 300 to determine a distance (e.g. a distance to another device) using, for example, multi-frequency phase slope based or time-of-flight based ranging techniques. After completion of the specified operation, the method flow moves to block 410 and the ranging control module 328 determines if the frequency scan is complete—that is, whether the specified operation has been performed at each frequency in the set of scan frequencies identified at block 402. If not, the method flow moves to block 412 and the ranging control module 328 determines the next scan frequency in the set of scan frequencies.

At block 414, the CFTE 215 determines a CFT setting based on the target frequency selected at block 412. Example methods for determining the CFT value are described below with respect to FIGS. 5-7. At block 416 the ranging control module 328 places the PLL 101 in the open-loop mode by, for example, disabling the fractional divider 214. At block 418 the CFTE programs the VCO 208 with the CFT value, thereby setting the state of one or more varactors of the VCO 208 according to the CFT value. At block 420 the PLL 101 computes a fractional divider value based on the selected target frequency and programs the computed fractional divider value to the fractional divider 214. For example, in one embodiment the fractional divider value is calculated according to the following formula:

$$N_{div} = \frac{VCO_f}{4 * F_{ref}}$$

where $N_{div}$ is the fractional divider value, $VCO_f$ is the frequency of the output signal of the VCO 208, and $F_{ref}$ is the reference frequency provided by the frequency source 202.

At block 422, the ranging control module 328 closes the PLL 101 (that is, places the PLL 101 in a closed-loop state) and waits the specified amount of time for the RF OUTPUT signal to settle. In at least one embodiment, after settling the PLL 101 can perform a built-in self-test procedure to ensure that no errors have occurred during the locking process. The method flow proceeds to block 408, and the transceiver 325 performs the specified operation with the RF OUTPUT signal tuned to the target frequency.

Returning to block 410, once the frequency scan is complete (that is, once the specified operation has been performed at each of the target frequencies in the set of frequencies identified at block 402) the method flow proceeds to blocks 424 and the ranging control module 328 instructs the TSM 320 to place the transceiver 325 in the low-power mode. Thus, using the method 400 depicted at FIG. 4, the transceiver 325 is maintained in the active mode until the frequency scan is complete, and is not transitioned to the low-power mode after each specified operation at a given target frequency. This reduces the overhead associated with the frequency scan, including the time required to execute the scan and the power consumed by the frequency scan.

Figure 5:
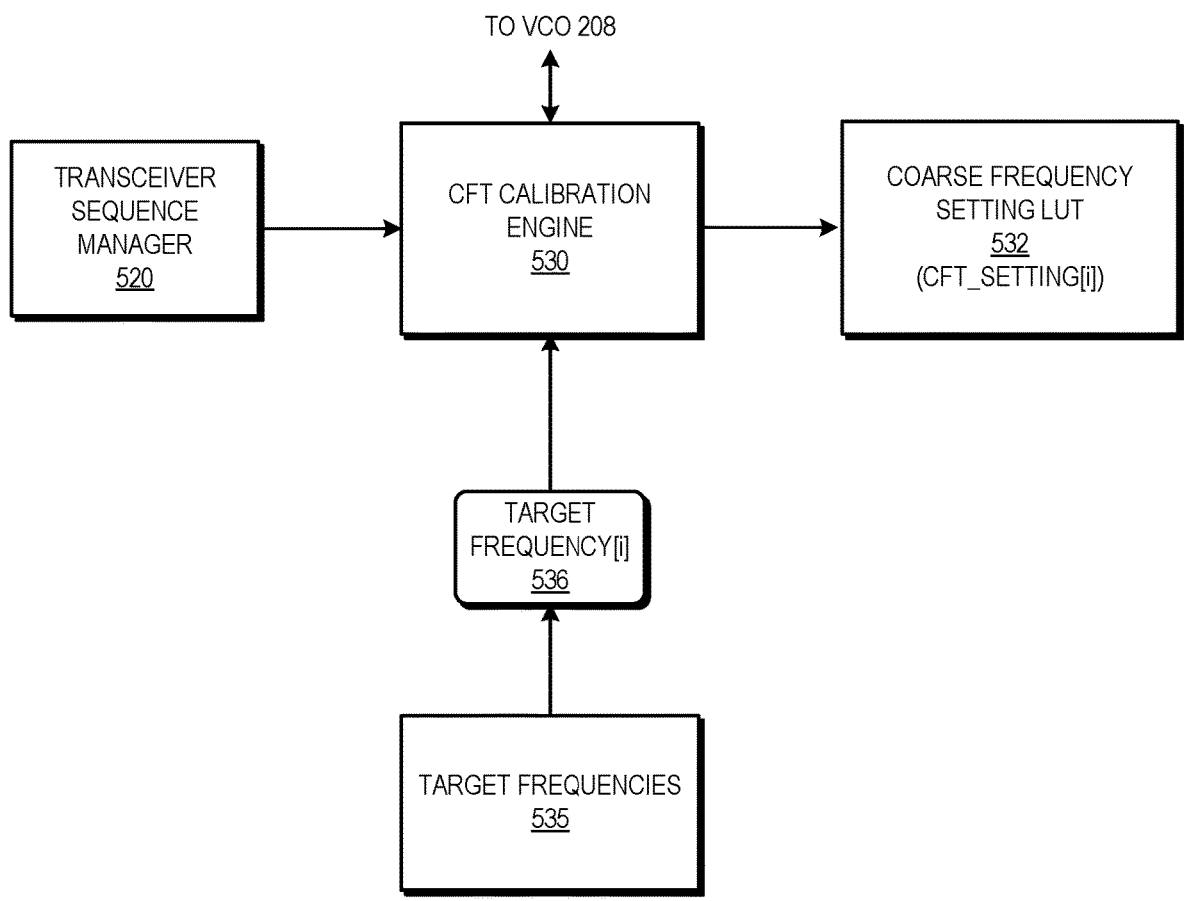
FIG. 5 is a block diagram of a coarse frequency tune engine (CFTE) of the PLL of FIG. 1, wherein the CFTE populates a lookup table of coarse frequency settings in accordance with at least one embodiment.
Figure 6:
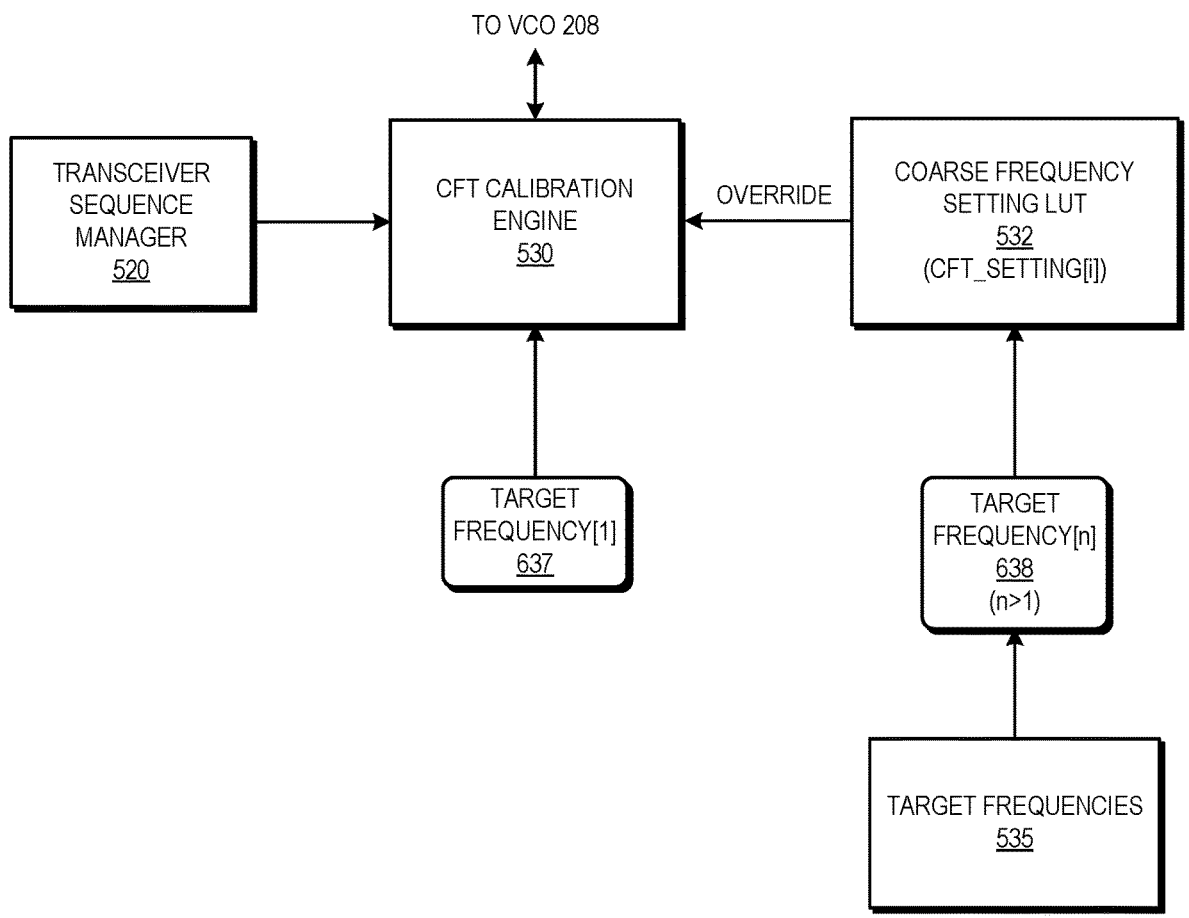
FIG. 6 is a block diagram of the CFTE of FIG. 5, wherein the CFTE uses the lookup table of coarse frequency settings during a frequency scan in accordance with at least one embodiment.

As noted above, the CFTE 215 can determine a CFT setting for the VCO 108 in several different ways including overriding a coarse frequency tune value, overriding a coarse frequency target value, or a combination thereof. For example, in at least one embodiment the CFTE can include one or more registers to store one or more of a coarse frequency tune value and a coarse frequency target override value, and a control register to indicate whether the override values or tune or target values generated by the CFTE 215 are to be used. FIGS. 5-8 illustrate different techniques, and associated configurations of the CFTE 215, for determining the CFT setting in accordance with different embodiments. For example, FIGS. 5 and 6 illustrate using a lookup table (LUT) of pre-calibrated CFT settings in accordance with at least one embodiment.

Turning to FIG. 5, the figure illustrates a block diagram of a CFTE 515 configured to populate a lookup table of pre-calibrated CFT settings in accordance with at least one embodiment. In the depicted example, the CFTE 515 includes a transceiver sequence manager 520, a CFT calibration engine, a CFS lookup table (LUT) 532, and a set of target frequencies 535.

The transceiver sequence manager 520 is generally configured to initiate a pre-calibration sequence at the CFTE 515. The CFT calibration engine 530 is generally configured to generate CFT settings based on the target frequencies 535 during the pre-calibration, CFS LUTCFS LUT. The pre-calibration period can be executed during characterization or other configuration period of the device 300 (FIG. 3), in response to a reset or startup of the device 300, or during any other appropriate period. In at least one embodiment, the pre-calibration period corresponds to the first time the device 300 performs a frequency sweep with a given set of target frequencies 535. During the pre-calibration period, the CFT calibration engine 530 sequentially retrieves each target frequency, designated target frequency[i] 536, from the set of target frequencies 535. For each target frequency[i], the CFT calibration engine calculates, a CFT setting using a successive approximation algorithm as described above or other CFT setting algorithm, and stores each CFT setting at an entry of the CFS LUT 532.

FIG. 6 illustrates the CFTE 515 using the CFS LUT 532 during a frequency scan in accordance with at least one embodiment. In the illustrated example, during a frequency scan, the CFT calibration engine 530 calculates a CFT setting for an initial target frequency, designated target frequency [1] 637, of the set of target frequencies 535, using the CFT calibration engine 530 (e.g., by using the successive approximation technique). For all other target frequencies, designated target frequency[n] 638, the CFTE 515 overrides the CFT value calculated by the CFTE calibration engine 530 with a corresponding entry of the CFS LUT 532.

In at least one embodiment, the CFS LUT 532 stores a different CFT setting for each target frequency in the set of target frequencies 535. In at least one other embodiment, two or more target frequencies share an entry of the CFS LUT 532, such that the two or more target frequencies correspond to the same CFT setting. Thus, the CFS LUT 532 can include a different CFT setting for every M target frequencies of the set of target frequencies 535, where M is an integer greater than one. For example, in some embodiments the PLL 101 may have a wide locking range, such that the PLL 101 can lock to a target frequency using a CT setting that is a plurality of CT steps away from the closest CT value, where the CT step size is based upon the size of the varactors used by the VCO 208. By employing the same CT setting for different target frequencies, the CFTE 515 can reduce the overhead associated with pre-calibration.

Figure 7:
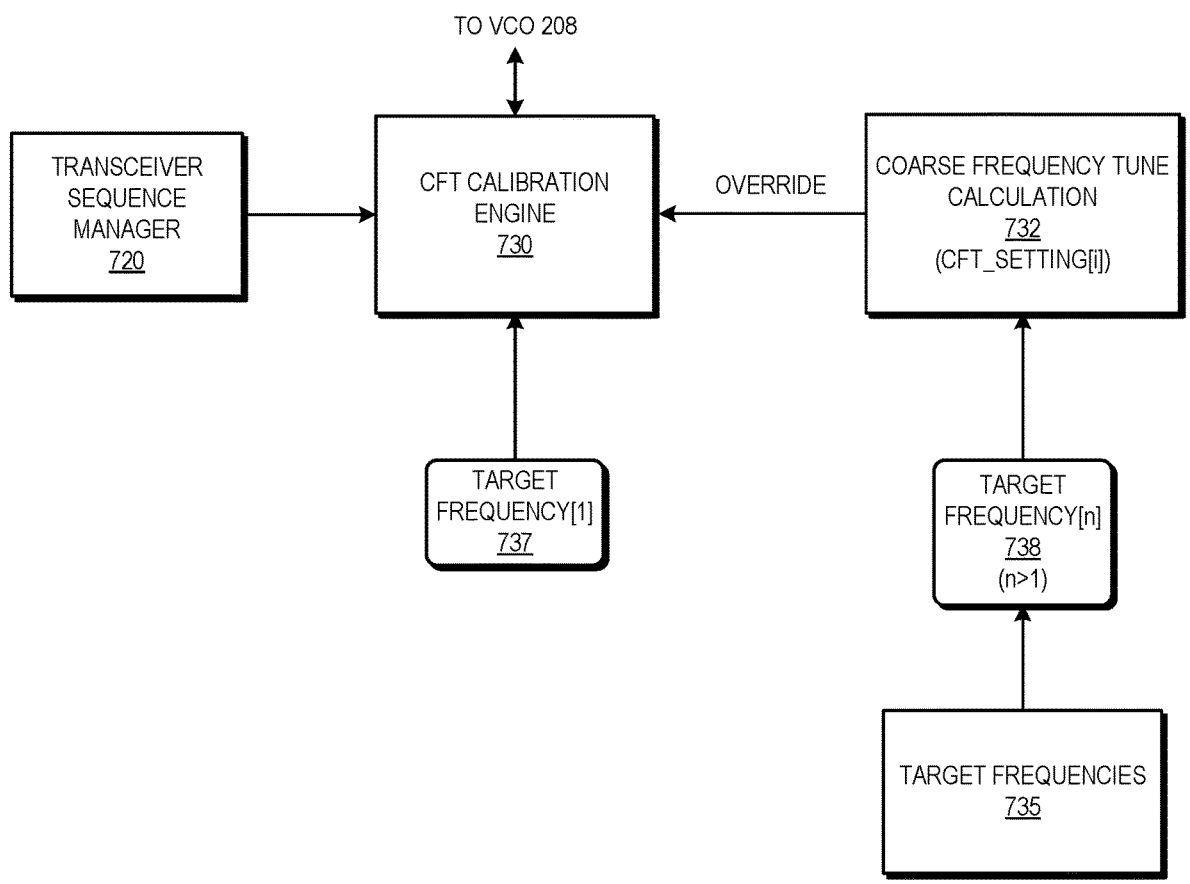
FIG. 7 is a block diagram of the CFTE of the PLL of FIG. 1, wherein the CFTE employs an interpolative coarse frequency tuning value calculation by overriding coarse frequency tuning values during a frequency scan in accordance with at least one embodiment.

FIG. 7 illustrates a block diagram of a CFTE 615 configured to identify the CFT setting based on interpolating CFT settings in accordance with at least one embodiment. In the depicted example, the CFTE 615 includes a transceiver sequence manager 720, a CFT calibration engine 730, a CFT calculation engine 732, and a set of target frequencies 635. During a frequency scan, the CFT calibration engine 730 calculates a CFT setting for an initial target frequency designated target frequency [1] 737. The CFT calibration engine 730 calculates the CFT setting using a successive approximation algorithm as described above, or other CFT setting algorithm, provides the CFT setting to the VCO 208. The VCO 208 programs the state of one or more varactors based on the CFT setting stored at the CFT register 638.

For subsequent target frequencies after the initial target frequency, designated target frequency[n] 738, the coarse frequency tune calculation engine 732 calculates an interpolated CFT setting according to the following formula:

$$CFT_n = CFT_0 + \text{round}\left(\frac{(f_{target\_n} - f_{target\_0})}{\text{average\_CT\_f}_{step}}\right)$$

where CFTn is the CFT setting for the nth target frequency 738, $CFT_0$ is the CFT setting for the initial target frequency 737 calculated CFT calibration engine 730 as described above, $f_{target\_n}$ is the nth target frequency 738, $f_{target\_0}$ is the initial target frequency 737, and average_CT_$f_{step}$ is the average varactor frequency step size for the varactors of the VCO 208. For each target frequency 378, The coarse frequency tune calculation engine overrides the CFT setting calculated by the CFT calibration engine 730 for the initial target frequency 737. It will be appreciated that in other embodiments using a different implementation architecture of the CFT varactor bank, the above linear interpolation CFT estimation equation may be augmented using, e.g., a higher order polynomial or an exponential estimation equation.

Figure 8:
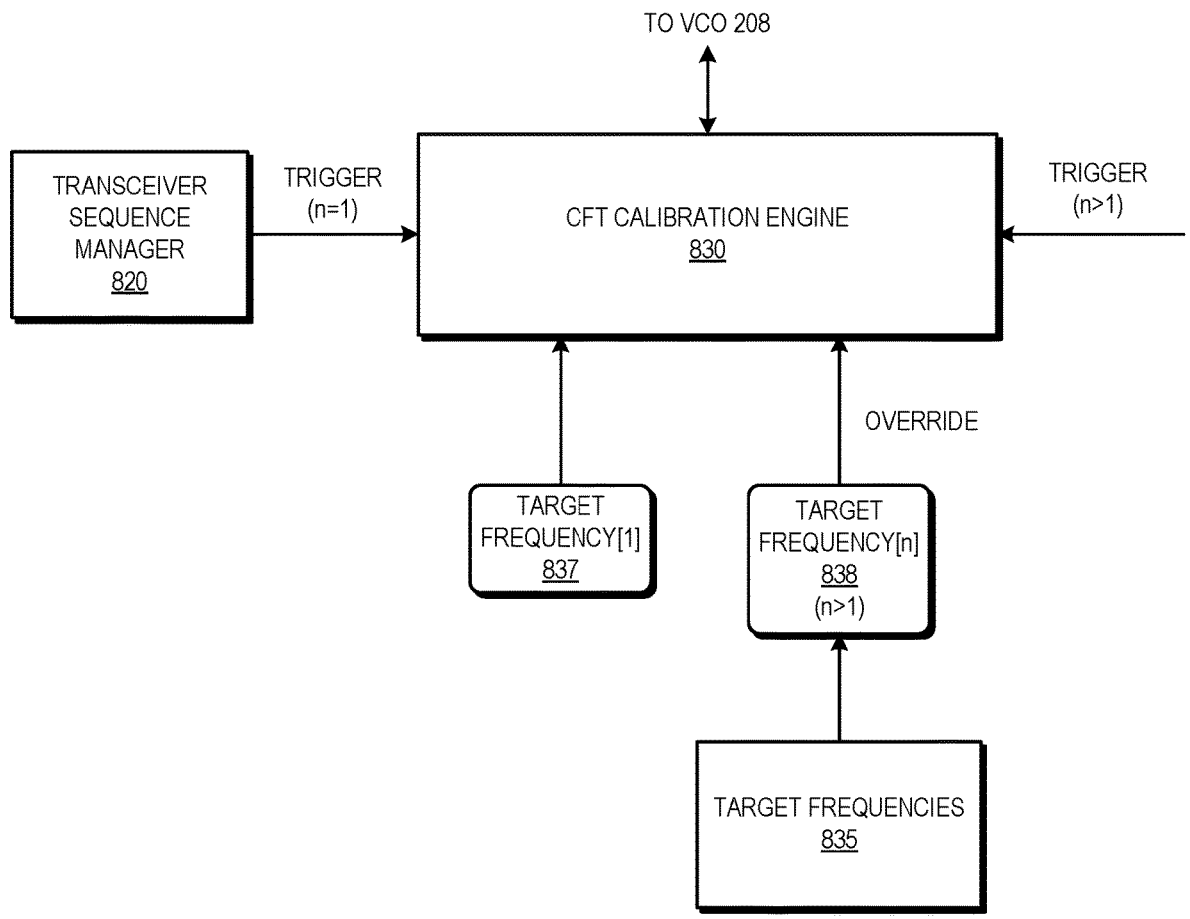
FIG. 8 is a block diagram of the CFTE of the PLL of FIG. 1, wherein the CFTE employs a triggered coarse frequency calibration engine by setting an override coarse-frequency targets during a frequency scan in accordance with at least one embodiment.

FIG. 8 illustrates a block diagram of a CFTE 815 configured to identify the CFT setting based on triggering calculation of CFT settings in accordance with at least one embodiment. In the depicted example, the CFTE 815 includes a transceiver sequence manager 820, a CFT calibration engine 830, and a set of target frequencies 835. During a frequency scan, for an initial target frequency, designated target frequency [1] 837, the transceiver sequence manager triggers calculation of a CFT setting. In response, the CFT calibration engine 830 calculates a CFT setting for the initial target frequency 837. using a successive approximation algorithm as described above, or other CFT setting algorithm. The CFT calibration engine 830 provides the CFT setting to the VCO 208, which programs the state of one or more varactors based on the CFT setting.

For each other target frequency of the set of target frequencies 835 other than the initial target frequency 837 (designated target frequency[n] 838), software overrides the initial target frequency 837 with the nth target frequency 838 and triggers calculation of the corresponding CFT value at the CFT calibration engine 830. Thus, in the illustrated embodiment of FIG. 7, the CFTE 815 is configured to calculate a CFT setting for each target frequency using the successive approximation algorithm, when triggered.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
placing a radio of a device in an active mode, the radio comprising a phase locked loop (PLL), which in turn comprises a voltage-controlled oscillator (VCO) and a divider; and
while maintaining the radio in the active mode:
determining a first coarse frequency tuning value based on a first target frequency;
determining a first fractional divider value based on the first target frequency;
placing the PLL in an open-loop configuration;
while the PLL is in the open-loop configuration, programming the VCO with the first coarse frequency tuning value, and programming the divider with the first fractional divider value;
placing the PLL in a closed-loop configuration with the VCO programmed with the first coarse frequency tuning value and the divider programmed with the first fractional divider value;
with the VCO programmed with the first coarse frequency tuning value and the divider programmed with the first fractional divider value, performing a first operation at the radio based on an output signal of the PLL while it is in the closed-loop configuration;
determining a second coarse frequency tuning value based on a second target frequency;
determining a second fractional divider value based on the second target frequency;
placing the PLL in the open-loop configuration after performing the first operation;
while the PLL is in the open-loop configuration, programming the VCO with the second coarse frequency tuning value, and programming the divider with the second fractional divider value;
placing the PLL in the closed-loop configuration with the VCO programmed with the second coarse frequency tuning value and the divider programmed with the second fractional divider value; and
with the VCO programmed with the second coarse frequency tuning value and the divider programmed with the second fractional divider value, performing a second operation at the radio based on an output signal of the PLL while it is in the closed-loop configuration.

2. The method of claim 1, wherein determining the first coarse frequency tuning value comprises identifying the first coarse frequency tuning value based on a look-up table of pre-calibrated coarse frequency tuning values.

3. The method of claim 2, wherein the look-up table comprises a different pre-calibrated coarse frequency tuning value for each of a plurality of target frequencies.

4. The method of claim 2 wherein the look-up table comprises a different coarse frequency tuning value for every M target frequencies of a plurality of target frequencies, where M is an integer greater than one.

5. The method of claim 4, wherein M is based on a varactor size associated with the VCO of the PLL.

6. The method of claim 5, wherein M is further based on a locking range of the PLL.

7. The method of claim 1, wherein determining the first coarse frequency tuning value comprises identifying the first coarse frequency tuning value based on an interpolation of an initial coarse frequency tuning value calculated based on an initial target frequency.

8. The method of claim 7, wherein the interpolation is further based on a frequency step size associated with the VCO of the PLL.

9. The method of claim 7, further comprising determining the initial coarse frequency tuning value based on a successive approximation of comparisons of an output signal of the VCO with the initial target frequency.

10. The method of claim 1, wherein determining the first coarse frequency tuning value comprises identifying the first coarse frequency tuning value based on a successive approximation of comparisons of an output signal of the VCO with a corresponding target frequency.

11. A method, comprising:
maintaining a radio in an active mode during a frequency scan at the radio of a plurality of target frequencies, the frequency scan comprising:
determining a first coarse frequency tuning value based on a first target frequency;
determining a first fractional divider value based on the first target frequency;
placing the PLL in an open-loop configuration;
while the PLL is in the open-loop configuration, programming the VCO with the first coarse frequency tuning value, and programming the divider with the first fractional divider value;
placing the PLL in a closed-loop configuration with the VCO programmed with the first coarse frequency tuning value and the divider programmed with the first fractional divider value;
determining a second coarse frequency tuning value based on a second target frequency;
determining a second fractional divider value based on the second target frequency;
placing the PLL in the open-loop configuration after programming the VCO with the first coarse frequency tuning value and the divider with the first fractional divider value;
while the PLL is in the open-loop configuration, programming the VCO with the second coarse frequency tuning value, and programming the divider with the second fractional divider value;
placing the PLL in the closed-loop configuration with the VCO programmed with the second coarse frequency tuning value and the divider programmed with the second fractional divider value.

12. A device comprising:
a radio comprising a phase locked loop (PLL), which in turn comprises a voltage-controlled oscillator (VCO) and a divider, wherein the radio, while in an active mode is configured to:
determine a first coarse frequency tuning value based on a first target frequency;
determine a first fractional divider value based on the first target frequency;
place the PLL in an open-loop configuration;

while the PLL is in the open-loop configuration, program the VCO with the first coarse frequency tuning value, and program the divider with the first fractional divider value;
place the PLL in a closed-loop configuration with the VCO programmed with the first coarse frequency tuning value and the divider programmed with the first fractional divider value; and
with the VCO programmed with the first coarse frequency tuning value and the divider programmed with the first fractional divider value, perform a first operation at the radio based on an output signal of the PLL while it is in the closed-loop configuration;
determine a second coarse frequency tuning value based on a second target frequency;
determine a second fractional divider value based on the second target frequency;
place the PLL in the open-loop configuration after performing the first operation;
while the PLL is in the open-loop configuration, program the VCO with the second coarse frequency tuning value, and program the divider with the second fractional divider value;
place the PLL in the closed-loop configuration with the VCO programmed with the second coarse frequency tuning value and the divider programmed with the second fractional divider value; and
with the VCO programmed with the second coarse frequency tuning value and the divider programmed with the second fractional divider value, perform a second operation at the radio based on an output signal of the PLL while it is in the closed-loop configuration.

13. The device of claim 12, wherein the radio determines the coarse frequency tuning value by identifying the coarse frequency tuning value based on a look-up table of pre-calibrated coarse frequency tuning values.

14. The device of claim 13, wherein the look-up table comprises a different pre-calibrated coarse frequency tuning value for each of a plurality of target frequencies.

15. The device of claim 13, wherein the look-up table comprises a different coarse frequency tuning value for every M target frequencies of a plurality of target frequencies, where M is an integer greater than one.

16. The device of claim 15, wherein M is based on a varactor size associated with the VCO of the PLL.

17. The device of claim 16, wherein M is further based on a locking range of the PLL.

18. The device of claim 12, wherein the radio determines the first coarse frequency based on an interpolation of an initial coarse frequency tuning value calculated based on an initial target frequency.

19. The device of claim 18, wherein the radio determines the first coarse frequency tuning value based on a frequency step size associated with the VCO of the PLL.

20. The device of claim 19 wherein the radio determines the initial coarse frequency tuning value based on a successive approximation of comparisons of an output signal of the VCO with the initial target frequency.

* * * * *